(12) United States Patent
Brown et al.

(10) Patent No.: US 6,498,372 B2
(45) Date of Patent: Dec. 24, 2002

(54) CONDUCTIVE COUPLING OF ELECTRICAL STRUCTURES TO A SEMICONDUCTOR DEVICE LOCATED UNDER A BURIED OXIDE LAYER

(75) Inventors: Jeffrey S. Brown, Middlesex, VT (US); Robert J. Gauthier, Jr., Hinesburg, VT (US); Jed H. Rankin, Burlington, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/785,432

(22) Filed: Feb. 16, 2001

(65) Prior Publication Data

US 2002/0113267 A1 Aug. 22, 2002

(51) Int. Cl.[7] ................................................. H01L 29/72
(52) U.S. Cl. .................... 257/355; 257/74; 257/211; 257/278; 257/347; 257/352
(58) Field of Search .................. 257/355, 74, 211, 257/278, 347, 352

(56) References Cited

U.S. PATENT DOCUMENTS

| | | |
|---|---|---|
| 4,423,431 A | 12/1983 | Sasaki |
| 4,649,627 A | 3/1987 | Abernathey et al. |
| 4,889,829 A | 12/1989 | Kawai |
| 5,116,768 A | 5/1992 | Kawamura |
| 5,338,965 A | 8/1994 | Malhi |
| 5,525,814 A | 6/1996 | Malhi |
| 5,631,485 A | 5/1997 | Wei et al. |
| 5,740,099 A | 4/1998 | Tanigawa |
| 5,889,293 A * | 3/1999 | Rutten et al. .................. 257/74 |
| 5,894,152 A * | 4/1999 | Jaso et al. .................. 257/347 |
| 5,923,067 A | 7/1999 | Voldman |
| 5,956,597 A | 9/1999 | Furukawa et al. |
| 6,034,399 A | 3/2000 | Brady et al. |

* cited by examiner

Primary Examiner—Edward Wojciechowicz
(74) Attorney, Agent, or Firm—Schmeiser, Olsen & Watts; Mark F. Chadurjian (57) ABSTRACT

A method and structure for conductively coupling electrical structures to a semiconductor device located under a silicon on insulator (SOI) layer. The SOI layer is formed on a bulk semiconductor substrate. A trench structure through the SOI layer is formed, wherein an end of the trench structure interfaces with the bulk semiconductor substrate. A semiconductor device is formed in the bulk semiconductor substrate, wherein the semiconductor device includes P[+] and N[+] diffusions. Conductive plugs are formed through the trench structure such that the conductive plugs are self-aligned with, and in conductive contact with, the diffusions. The semiconductor device in the bulk semiconductor substrate may include an electrostatic discharge device (ESD). The bulk semiconductor substrate, which has a high thermal conductivity, serves as an effective medium for dissipating heat generated by the ESD.

26 Claims, 13 Drawing Sheets

CONDUCTIVE COUPLING OF ELECTRICAL STRUCTURES TO A SEMICONDUCTOR DEVICE LOCATED UNDER A BURIED OXIDE LAYER

BACKGROUND OF THE INVENTION

1. Technical Field

The present invention relates to a method and structure for conductively coupling electrical structures to a semiconductor device located under a buried oxide layer.

2. Related Art

An electrostatic discharge device (ESD) located within a substrate and above a buried oxide layer is surrounded by thermally insulative material in silicon-on-insulator (SOI) structures. For example, the ESD device may be surrounded by the buried oxide layer on the bottom, small trench isolations on the sides, and interlevel dielectric on the top. An electrostatic discharge device must be able to handle large electrical currents that result from static discharge, from a human body or the environment onto an integrated circuit coupled to, or integral with, the substrate. Such large electrical currents generate substantial heat which cannot be effectively dissipated away from the ESD device, because of the surrounding electrically and thermally insulative material.

A method and structure is needed for effectively dissipating heat during an electrostatic discharge event on SOI.

SUMMARY OF THE INVENTION

The present invention provides an electronic structure, comprising:

a bulk semiconductor substrate having a semiconductor device, wherein the semiconductor device includes M diffusions, wherein M is at least 2, wherein a first diffusion of the M diffusions is a P$^+$ diffusion, and wherein a second diffusion of the M diffusions is a N$^+$ diffusion;

a silicon-on-insulator (SOI) structure on the bulk semiconductor substrate, wherein the SOI structure includes an insulator layer on the bulk semiconductor substrate and a semiconductor layer on the insulator layer; and M conductive plugs self-aligned with the M diffusions and extending through a portion of the SOI layer such that an end of each conductive plug is in conductive contact with a corresponding diffusion of the M diffusions.

The present invention provides a method for forming an electronic structure, comprising the steps of:

providing a bulk semiconductor substrate;

forming a silicon-on-insulator (SOI) structure on the bulk semiconductor substrate, wherein the SOI structure includes an insulator layer on the bulk semiconductor substrate and a semiconductor layer on the insulator layer;

forming a trench structure through the SOI layer, wherein an end of the trench structure is interfaced with the bulk semiconductor substrate;

forming a semiconductor device in the bulk semiconductor substrate by use of the trench structure, wherein the semiconductor device includes M diffusions, wherein M is at least 2, wherein a first diffusion of the M diffusions is a P$^+$ diffusion, and wherein a second diffusion of the M diffusions is a N$^+$ diffusion; and forming M conductive plugs self-aligned with the M diffusions and extending through a portion of the SOI layer such that an end of each conductive plug is in conductive contact with a corresponding diffusion of the M diffusions.

The present invention provides a method and structure for effectively dissipating heat during an electrostatic discharge event.

DETAILED DESCRIPTION OF THE INVENTION

Figure 1:
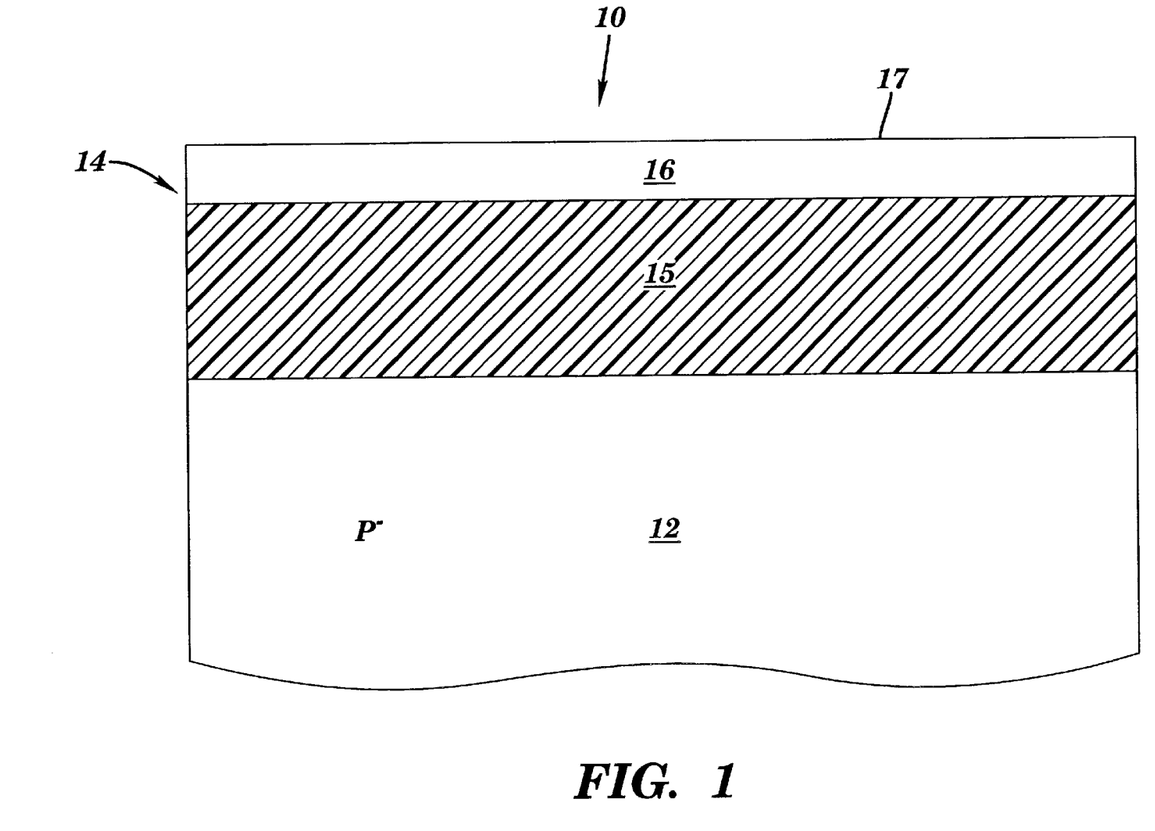
FIG. 1 depicts a front cross-sectional view of an electronic structure having a silicon-on-insulator (SOI) structure on a bulk semiconductor substrate, in accordance with the embodiments of the present invention.

FIG. 1 illustrates a front cross-sectional view of an electronic structure 10 having a silicon-on-insulator (SOI) structure 14 on a bulk semiconductor substrate 12, in accordance with embodiments of the present invention. The SOI structure 14 includes a semiconductor layer 16 on an insulator layer 15. The insulator layer 15 is on the bulk semiconductor substrate 12. The SOI structure 14 that is on the bulk semiconductor substrate 12 may be formed by any method known to one of ordinary skill in the art such as by the SIMOX (Separation by IMplanted OXygen) method, or a wafer bonding method (i.e., bonding a semiconductor wafer to the insulator layer 15 that has been formed by growing a thermal oxide on the bulk semiconductor substrate 12). The semiconductor layer 16 is generally thinner than the insulator layer 15. For example, the insulator layer 15 may have a thickness in a range of about 1.0 to about 10 microns, while the semiconductor layer 16 may have a thickness in a range of about 0.1 to about 1.0 microns. The top surface 17 of the semiconductor layer 16 is exposed.

The bulk semiconductor substrate 12 includes a doped semiconductor material such as a $P^+$ semiconductor material (e.g., or a $P^+$ doped silicon material). Alternatively, the bulk semiconductor substrate 12 may include a $N^+$ doped semiconductor material (e.g., or a $N^+$ doped silicon material). The insulator layer 15 includes insulative material such as silicon dioxide ($SiO_2$). If the insulator layer 15 includes $SiO_2$, then the insulator layer 15 is typically called a buried oxide layer (BOX).

FIGS. 2A, 2B, and 3–5 describe formation of a semiconductor device (e.g., a diode, a bipolar transistor, a thyristor, etc.) below the insulator layer 15 and within the bulk semiconductor substrate 12, and formation of conductive plugs within the insulator layer 15. The semiconductor device may include an electrostatic discharge device (ESD). The bulk semiconductor substrate 12, which has a high thermal conductivity, serves as an effective medium for dissipating heat generated by the electrostatic discharge device (i.e., the semiconductor device). With the semiconductor device below the insulator layer 15, the present invention utilizes the bulk semiconductor substrate 12 to effectively dissipates heat from the semiconductor device, and the conductive plugs to provide a conductive interfacing between the semiconductor device and electrical structure above the insulator layer 15. Note that "conductive" means herein "electrically conductive," unless stated otherwise.

Figure 2A:
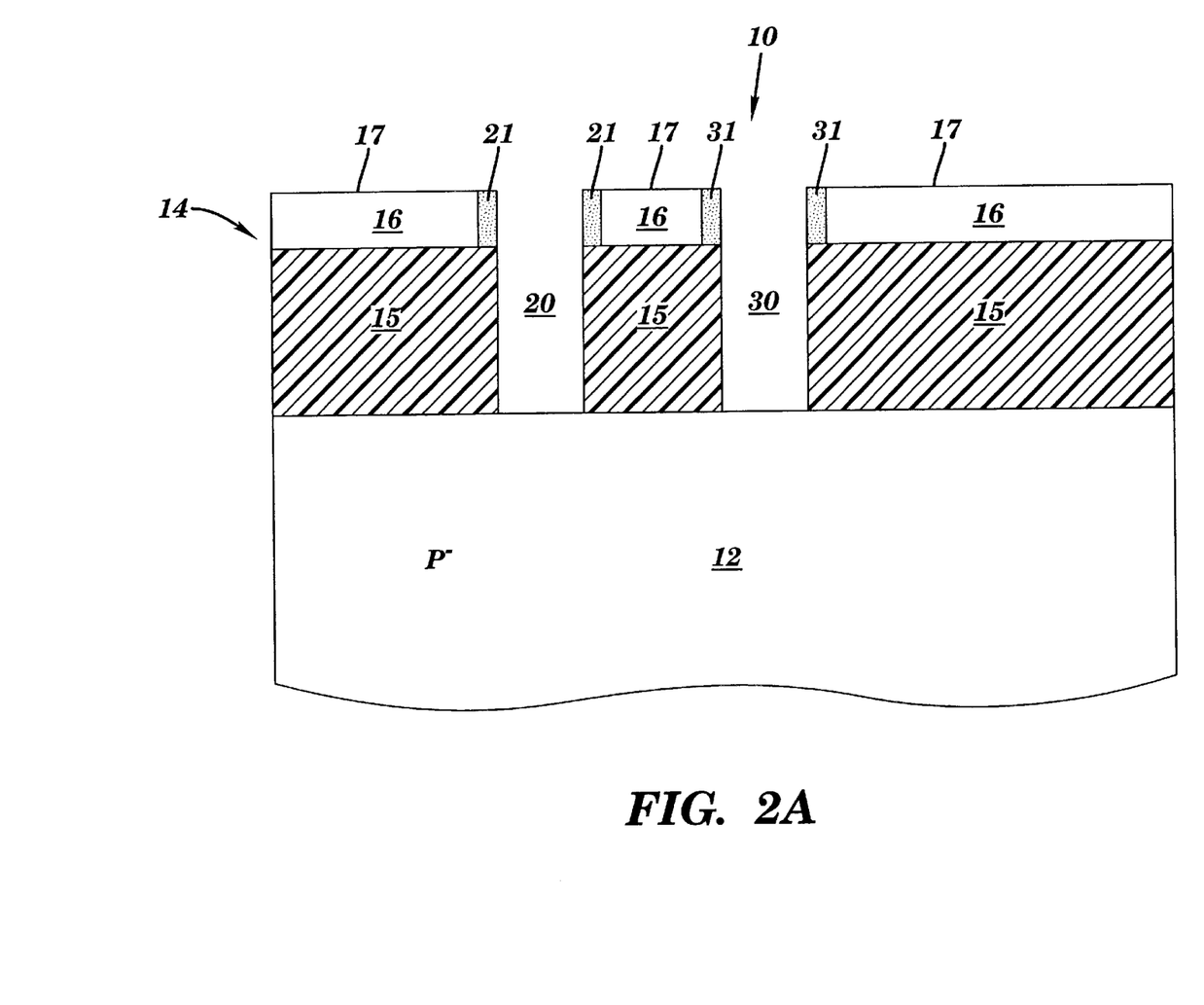
FIG. 2A depicts FIG. 1 after a first trench and a second trench have been formed through the SOI structure, with formation of a first insulating liner between the first trench and the semiconductor layer, and formation of a second insulating liner between the second trench and the semiconductor layer.

FIG. 2A illustrates FIG. 1 after a trench 20 and a trench 30 have been formed through the SOI structure 14, exposing portions of the bulk semiconductor substrate 12. The trench 20 and the trench 30 may be formed by any method known to one of ordinary skill in the art. For example, two small trench isolations (STI's) may be formed in the semiconductor layer 16 and each STI may filled with insulating material such as densified tetra-ethyl-ortho-silicate (TEOS). Then the top surface 17 of the semiconductor layer 16 is covered with photoresist, patterned (such as by masking) with respect to the STI's, and selectively exposed in accordance with the patterning to radiation (e.g., ultraviolet radiation). Insulating material of the STI's and insulative material of the insulative layer 15 are etched away, resulting in the trenches 20 and 30. The patterning associated with in FIG. 2A is such that only a central portion of the insulating material of the STI's is etched, leaving insulating material as an insulating liner 21 between the trench 20 and the semiconductor layer 16, and as an insulating liner 31 between the trench 30 and the semiconductor layer 16. The insulating liners 21 and 31 include the insulating material (e.g., TEOS). The insulating liners 21 and 31 serve to insulate the semiconductor layer 16 from conductive material to be inserted in the trenches 20 and 30, respectively, as will be described infra in conjunction with FIG. 4.

Figure 2B:
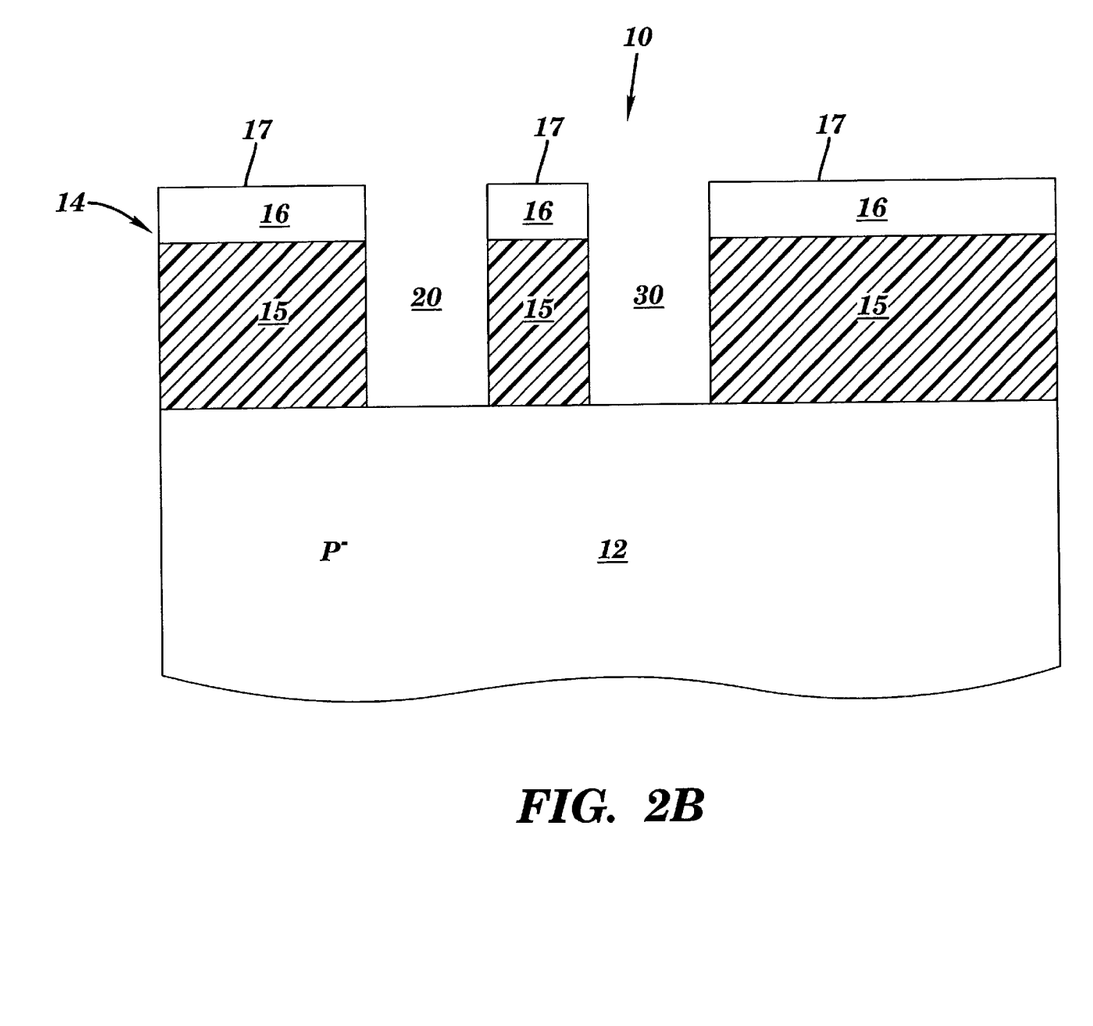
FIG. 2B depicts FIG. 2A without the first and second insulating liners.

An alternative patterning is such that all of the insulating material of the STI's is etched, wherein the insulating liners 21 and 31 would not be formed. FIG. 2B depicts FIG. 2A without the insulating liners, based on said alternative patterning. With the alternative patterning, the insulating liners 21 and 31 of FIG. 2A are replaced, in conjunction with FIG. 2B, with insulative liners 24 and 34, respectively, as shown infra in FIG. 3.

Figure 3:
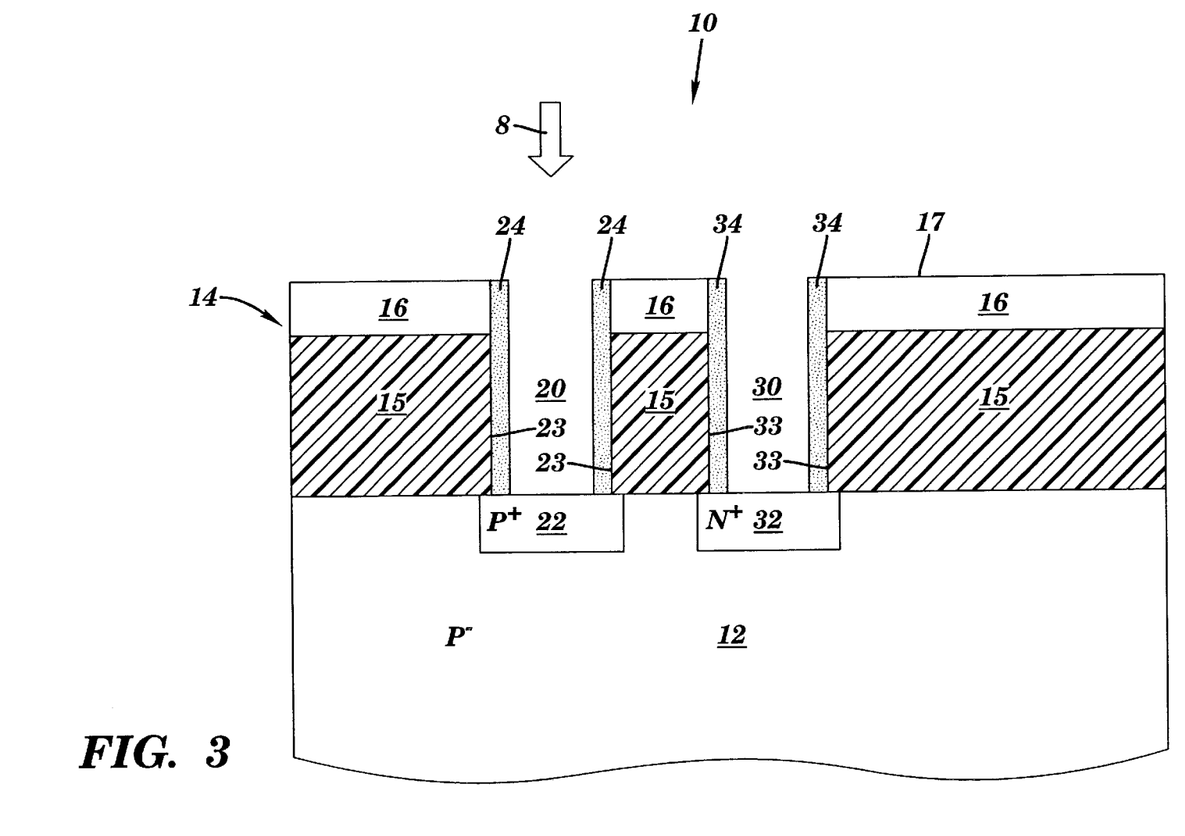
FIG. 3 depicts FIG. 2B after a P$^+$ diffusion and a N$^+$ diffusion have been formed in the bulk semiconductor substrate under the first trench and under the second trench, respectively, and after insulative liners have been formed on sidewalls of the first trench and the second trench.

FIG. 3 illustrates FIG. 2B after a $P^+$ diffusion 22 and a $N^+$ diffusion 32 have been formed in the bulk semiconductor substrate 12 under the trench 20 and under the trench 30, respectively. The $P^+$ diffusion 22 and the $N^+$ diffusion 32 are formed separately by any method known to one of ordinary skill in the art. For example, to form the $P^+$ diffusion 22, the top surface 17 of the semiconductor layer 16 and the trench 30 is masked with a masking material, and $P^+$ dopant is implanted in a direction 8 through the trench 20 and into a top portion of the bulk semiconductor substrate 12 under the trench 20. The masking is such that the $P^+$ dopant is prevented from striking with any portion of the electronic structure 10 except where the $P^+$ diffusion 22 is formed. After the $P^+$ diffusion 22 is formed, the masking material is removed by any known method such as by chemical removal. The $N^+$ diffusion 32 may be formed in a manner similar to the aforementioned method of forming the $P^+$ diffusion 22, or by any other method known to one of ordinary skill in the art. The $P^+$ diffusion 22 may be formed either before or after the $N^+$ diffusion 32 is formed. The trenches 20 and 30 constitute in combination a "trench structure" used for implanting dopants to form the $P^+$ diffusion 22 and the $N^+$ diffusion 32.

FIG. 3 illustrates an insulative liner 24 on a sidewall 23 of the trench 20, and an insulative liner 34 on a sidewall 33 of the trench 30. The insulative liners 24 and 34 may be formed on the sidewall 23 and 33, respectively, by any method known to one of ordinary skill in the art, such as by depositing oxide and spacer etching. Alternatively, thermal oxide (e.g., silicon dioxide) can be grown on SOI portions of sidewalls 23 and 33. The insulative liners 24 and 34 are alternatives to the insulating liners 21 and 31 (see FIG. 2A and accompanying discussion) for insulating the semiconductor layer 16 from conductive material to be inserted in the trenches 20 and 30, respectively, as will be described infra in conjunction with FIG. 4. The insulative liners 24 and 34 may be formed either before or after the $P^+$ diffusion 22 and the $N^+$ diffusion 32 are formed.

Figure 4:
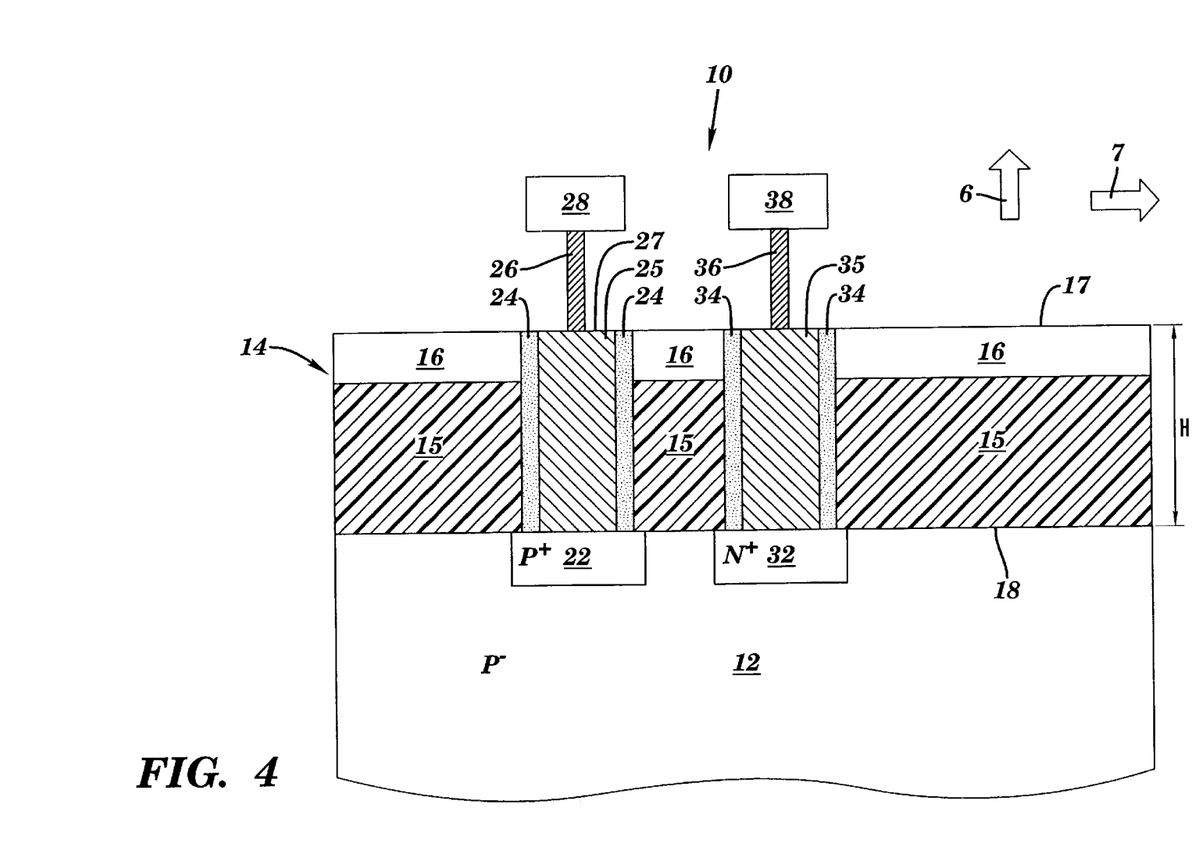
FIG. 4 depicts FIG. 3 after the first trench has been filled with conductive material to form a first conductive plug and the first conductive plug has been conductively coupled to a first electrical structure, and after the second trench has been filled with a second conductive material to form a second conductive plug and the second conductive plug has been conductively coupled to a second electrical structure.

FIG. 4 illustrates FIG. 3 with the trench 20 filled with conductive material to form a conductive plug 25 that is in conductive contact with the $P^+$ diffusion 22, and with the trench 30 filled with conductive material to form a conductive plug 35 that is in conductive contact with the $N^+$ diffusion 32. The insulative liners 24 and 34, or the insulating liners 21 and 31 (see FIG. 2A), collectively constitute an "insulative liner structure" for insulating the semiconductor layer 16 from the conductive plugs 25 and 35, respectively. The conductive plugs 25 and 35 are "through plugs."

The conductive material of the conductive plugs 25 and 35 may include a semiconductor material such as in-situ doped or implanted polysilicon, intrinsic poly doped from diffusions 22 and 32, a metal (e.g., tungsten or aluminum), or a metallic alloy. If the conductive material includes doped semiconductor material such as doped polysilicon, then the doped semiconductor material should be of a same conductivity type, and thus of the same polarity, as the diffusion below. For example, if the conductive material of the conductive plugs 25 and 35 include doped polysilicon, then the doped polysilicon of the conductive plugs 25 and 35 should be $P^+$ doped polysilicon in the conductive plug 25 for contact to the $P^+$ diffusion 22, and $N^+$ doped polysilicon in the conductive plug 35 for contact to the N+ diffusion 32. The trench 20 and the trench 30 may include a same conductive material or different conductive materials.

The conductive plug 25 and the conductive plug 35 may be formed by any method known to one of ordinary skill in the art. For example, if the conductive plug 25 includes P+ polysilicon, then the conductive plug 25 may be formed by depositing the P+ polysilicon within the trench 20, or alternatively depositing intrinsic polysilicon within the trench 20 followed by implantation of dopant into the intrinsic polysilicon in the trench 20 using a masking scheme analogous to the masking scheme used for forming the P+ diffusion 22 as described supra in conjunction with FIG. 3. After the conductive plug 25 is formed, a top surface 27 of the conductive plug 25 may be polished by any method known to one of ordinary skill in the art. If the conductive plug 35 includes N+ polysilicon, them the conductive plug 35 may be formed in a manner similar to the aforementioned method of forming the conductive plug 25, or by any other method known to one of ordinary skill in the art. Note that if implantation of dopant is used for forming both the conductive plug 25 and the conductive plug 35, then the masking and associated implantation of dopant into the intrinsic polysilicon must be done for the conductive plug 25 and the conductive plug 35 in different process steps.

The conductive plug 25 and the conductive plug 35 are shown as each having a height H extending from a bottom surface 18 of the insulator layer 15 to about the top surface 17 of the semiconductor layer 16. Alternatively, the conductive plug 25 and the conductive plug 35 may each have a height less than H, as measured in a direction 6 from the bottom surface 18 of the semiconductor layer 16. The conductive plug 25 and the conductive plug 35 may have a same height or different heights. If either or both of the conductive plug 25 and the conductive plug 35 have a height of about H, a placing of the conductive material in the trench 20 and/or the trench 30 may include overfilling the trench 20 and/or the trench 30 with the conductive material, followed with polishing, such as by chemical mechanical polishing (CMP) or any other suitable polishing method, that planarizes the top surface 17 of the semiconductor layer 16.

Previously, FIG. 2A depicted insulating liners 21 and 31, and alternatively FIG. 3 depicted insulative liners 24 and 34, for insulating the semiconductor layer 16 from the conductive plugs 25 and 35, respectively. It is within the scope of the present invention, however, to have no insulative separation between the semiconductor layer 16 and the conductive plugs 25 and 35. For example, it may be desired to have the conductive plug 25 resistively coupled by the P+ material of the bulk semiconductor substrate 12 to an electronic device.

The electronic device 10 may be a lower portion of a multilayered laminate comprising dielectric material above the semiconductor layer 16 in the direction 6. Accordingly, a subsequent processing step may include forming one or more dielectric layers (not shown) above the semiconductor layer 16 as well as electrical structures (e.g., conductive wiring, plated vias, etc.) within and above the one or more dielectric layers.

FIG. 4 shows the conductive plug 25 to be conductively coupled by a conductive interface 26 to an internal node or external pad 28, and the conductive plug 35 to be conductively coupled by a conductive interface 36 to an internal node or external pad 38. An "internal node" represents an electrically conductive location within the electronic structure 10 such as, inter alia, an electrically conductive location within a semiconductor chip encompassed by the electronic structure 10. An "external pad" represents an electrically conductive pad which is external to the electronic structure 10 such as, inter alia, an electrically conductive pad on a semiconductor chip which is external to the electronic structure 10. The conductive interface 26 and the conductive interface 36 may each include any type of conductive interface known to one of ordinary skill in the art, such as a composite of conductive contacts and conductive wiring lines. The internal node or external pad 28 and 38 may each be coupled to other electrical devices in the semiconductor layer 16 or in the bulk semiconductor substrate 12. Definitionally, the term "conductive node" stands for the phrase "internal node or external pad."

A combination of the P+ diffusion 22 and the N+ diffusion 32 may function as a diode. If the diode conducts large electrical currents, such as large currents generated during electrostatic discharge, then the bulk semiconductor substrate 12, which has a high thermal conductivity, serves as an effective medium for dissipating heat generated by the large electrical currents. The diode, when operated in reverse bias, is a diffusion capacitor.

Figure 5:
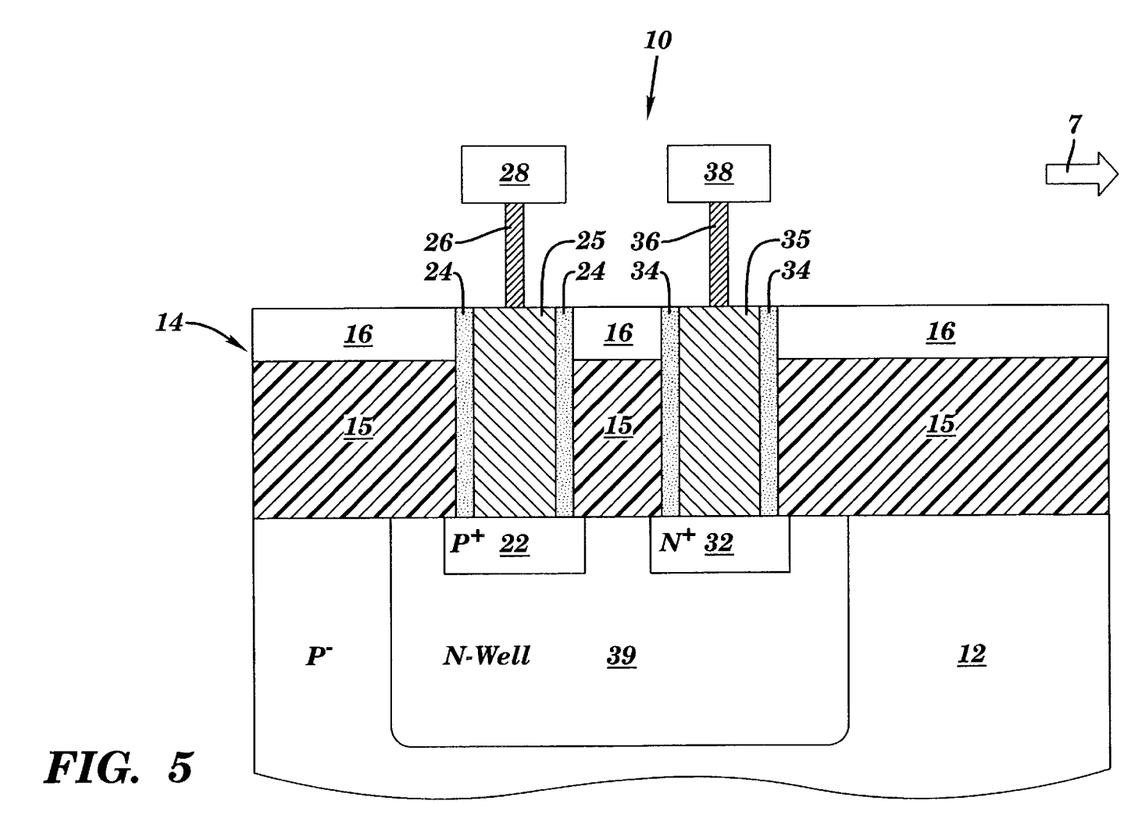
FIG. 5 depicts FIG. 4 with an addition of a doped well in the bulk semiconductor substrate.

FIG. 5 illustrates FIG. 4 with an addition of a doped well 39 in the bulk semiconductor substrate 12. For example, the doped well 39 may include a N-well. All variations and embodiments discussed supra for FIGS. 1–4 apply to FIG. 5.

Figure 6:
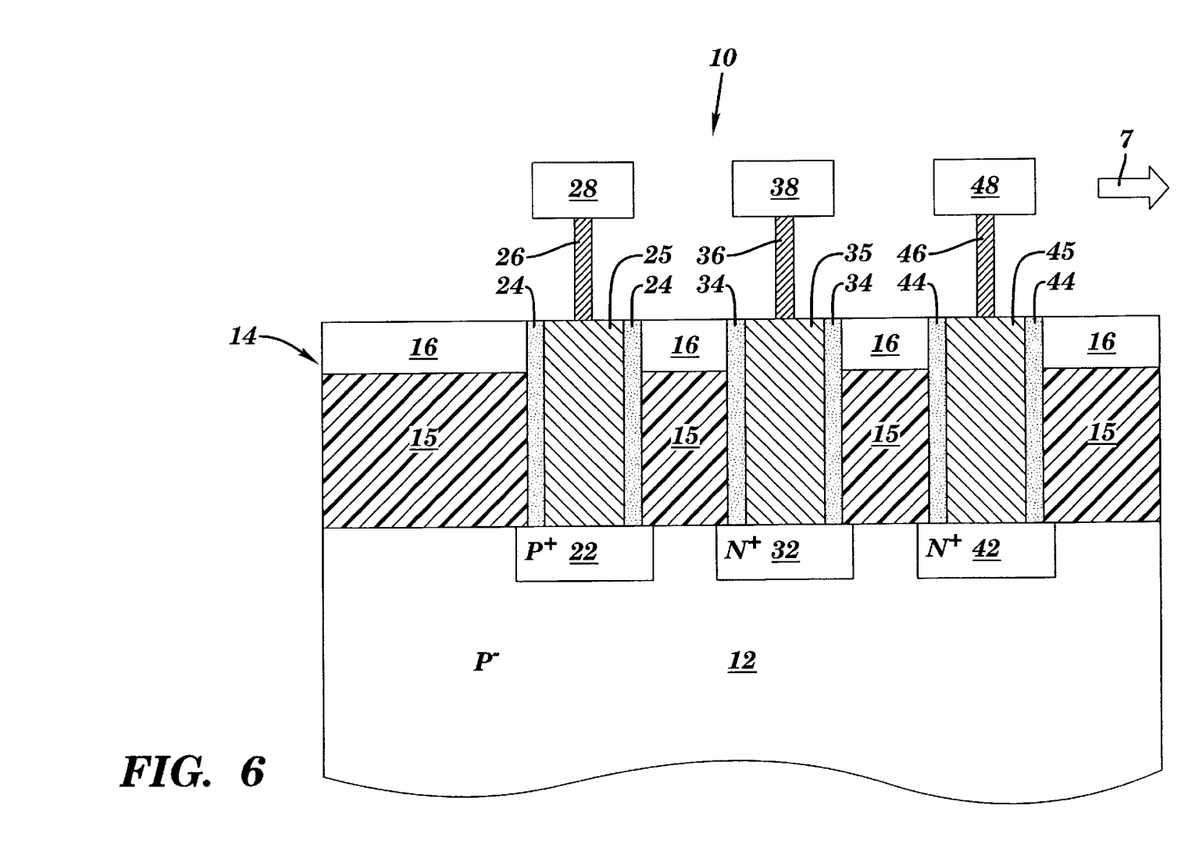
FIG. 6 depicts FIG. 4 with an addition of a second N$^+$ diffusion in the bulk semiconductor substrate.

FIG. 6 illustrates FIG. 4 with an addition of a N+ diffusion 42 in the bulk semiconductor substrate 12. The N+ diffusion 42 may be formed in any manner by which the N+ diffusion 32 may be formed. See FIG. 3 and accompanying text for a discussion supra of how the N+ diffusion 32 may be formed by implantation of dopant through the trench 30. Thus, the N+ diffusion 42 may be formed through a trench analogous to the trench 30 of FIG. 2A or FIG. 2B. The N+ diffusion 42 may be formed concurrent with formation of the N+ diffusion 32, or the N+ diffusion 42 may be formed before or after the N+ diffusion 32 is formed. The trenches 20 and 30 (see FIGS. 2A and 2B) that include the conductive plug 25 and 35 (see FIG. 4), together with the trench used to implant dopant to form the N+ diffusion 42, collectively constitute a "trench structure" used for implanting dopants to form the P+ diffusion 22, the N+ diffusion 32, and the N+ diffusion 42.

FIG. 6 also illustrates a conductive plug 45 in conductive contact with the N+ diffusion 42 and conductively coupled to an internal node or external pad 48 by a conductive interface 46. The internal node or external pad 48 has any characteristic or feature of the internal node or external pad 28 described supra in conjunction with FIG. 4. The conductive plug 45 in FIG. 6 may be formed in any manner by which the conductive plug 35 may be formed, and may include any conductive material that the conductive plug 35 may include. See FIG. 4 and accompanying text for a discussion supra of how the conductive plug 35 may be formed and conductive materials that the conductive plug 35 may include. Note that the conductive plug 45 is formed in the trench that was used to implant dopant to form the N+ diffusion 42. The conductive interface 46 may include any type of conductive interface known to one of ordinary skill in the art, such as a composite of conductive contacts and conductive wiring lines. The internal node or external pad 48 may be coupled to other electrical devices in the semiconductor layer 16 or in the bulk semiconductor substrate 12.

In FIG. 6, an insulative liner 44 insulates the semiconductor layer 16 from the conductive plug 45. The insulative liner 44 may be formed in any manner by which the insulative liner 34 may be formed. See FIG. 3 and accompanying text for a discussion supra of how the insulative liner 34 may be formed. As an alternative, the insulative liner 44 may be replaced by an insulating liner such as the insulating liner 21 described supra in relation to FIG. 2A, and may be formed in a same manner by which the insulating liner 21 may be formed. See FIG. 2A and accompanying text for a discussion supra of how the insulating liner 21 may be formed. The insulating liner replacing the insulative liner 44 alternatively insulates the semiconductor layer 16 from the conductive plug 45. As another alternative, it is within the scope of the present invention to have no insulative separation between the semiconductor layer 16 and the conductive plugs 45.

A combination of the $P^+$ diffusion 22, the $N^+$ diffusion 32, and the $N^+$ diffusion 42 may function as a lateral NPN bipolar transistor. Alternatively, the combination of the $P^+$ diffusion 22, the $N^+$ diffusion 32, and the $N^+$ diffusion 42 may function as a PNP bipolar transistor if the bulk semiconductor substrate 12 includes a $N^+$ material and if the polarities of the diffusions 22, 32, and 42 are reversed. If the PNP bipolar transistor or the NPN bipolar transistor conducts large electrical currents, such as large currents generated during electrostatic discharge, then the bulk semiconductor substrate 12, which has a high thermal conductivity, serves as an effective medium for dissipating heat generated by the large electrical currents.

Figure 7:
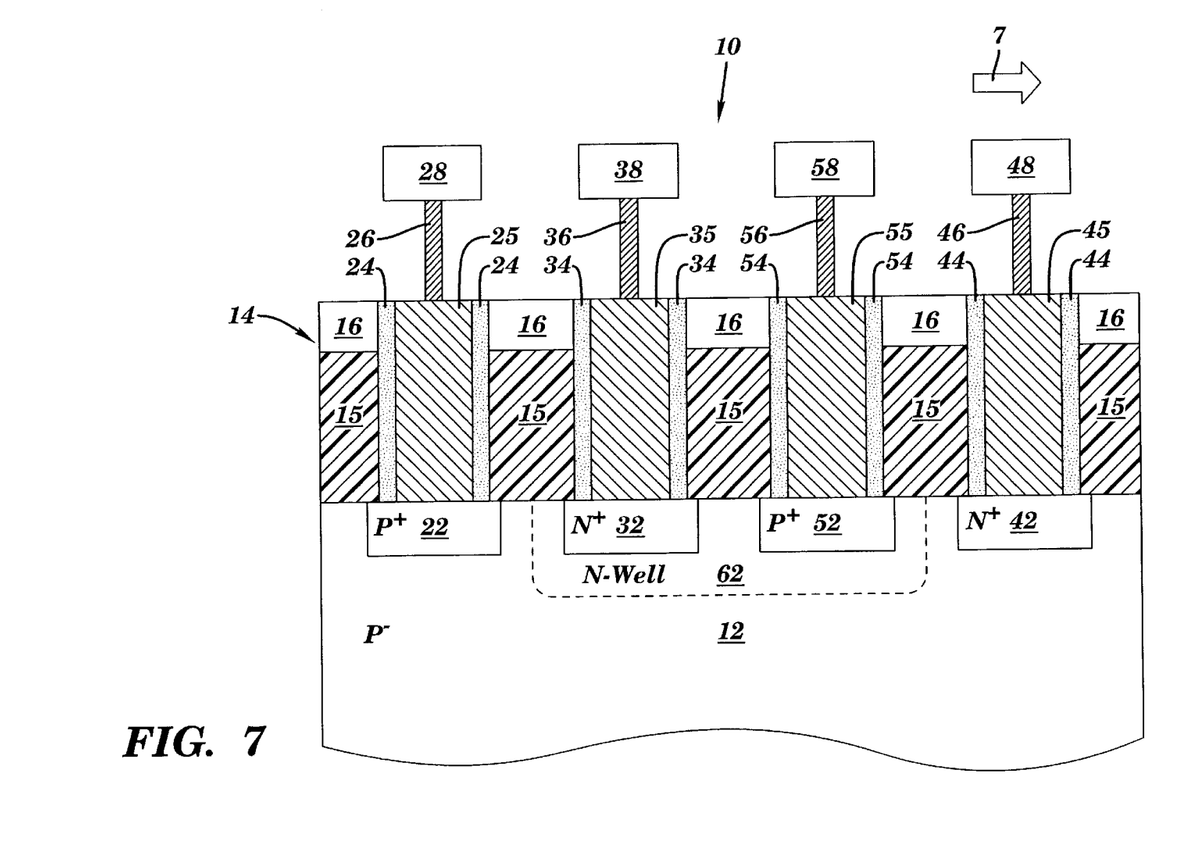
FIG. 7 depicts FIG. 6 with an addition of a second P$^+$ diffusion and an addition of a N-type well in the bulk semiconductor substrate.

FIG. 7 illustrates FIG. 6 with an addition of a $P^+$ diffusion 52 in an implanted N-well 62 in the bulk semiconductor substrate 12. The $N^+$ diffusion 32 is likewise implanted in the N-well 62. The $P^+$ diffusion 52 may be formed in any manner by which the $P^+$ diffusion 22 may be formed. See FIG. 3 and accompanying text for a discussion supra of how the diffusions may be formed by implantation of dopant through the trenches. Thus, the diffusion 52 may be formed through a trench analogous to the trench 20 of FIG. 2A or FIG. 2B. The $P^+$ diffusion 52 may be formed concurrent with formation of the $P^-$ diffusion 22, or the $P^+$ diffusion 52 may be formed before or after the $P^+$ diffusion 22 is formed. The trenches 20 and 30 (see FIGS. 2A and 2B) that include the conductive plugs 25 and 35, respectively (see FIG. 4), together with the trenches used to implant dopants to form the $N^+$ diffusion 42 and the $P^+$ diffusion 52, collectively constitute a "trench structure" used for implanting dopants to form the $P^+$ diffusion 22, the $N^+$ diffusion 32, the $N^+$ diffusion 42, and the $P^+$ diffusion 52.

FIG. 7 also illustrates a conductive plug 55 in conductive contact with the $P^+$ diffusion 52 and conductively coupled to internal node or external pad 58 by a conductive interface 56. The internal node or external pad 58 has any characteristic or feature of the internal node or external pad 28 described supra in conjunction with FIG. 4. The conductive plug 55 in FIG. 7 may be formed in any manner by which the conductive plug 25 may be formed, and may include any conductive material that the conductive plug 25 may include. See FIG. 4 and accompanying text for a discussion supra of how the conductive plug 25 may be formed and conductive materials that the conductive plug 25 may include. Note that the conductive plug 55 is formed in the trench that was used to implant dopant to form the $P^+$ diffusion 52. The N-well 62 can be formed by masking and implanting to provide an N-type dopant such as phosphorus in the bulk semiconductor substrate 12 before diffusions 22, 32, 42, and 52, and before conductive plug 35 and 55 are provided. A high temperature diffusion is then provided to form the N-well 62. Then implants are provided for diffusions 22, 32, 42, and 52.

In FIG. 7, an insulative liner 54 insulates the semiconductor layer 16 from the conductive plug 55. The insulative liner 54 may be formed in any manner by which the insulative liner 34 may be formed. See FIG. 3 and accompanying text for a discussion supra of how the insulative liner 34 may be formed. As an alternative, the insulative liner 54 may be replaced by an insulating liner such as the insulating liner 31 described supra in relation to FIG. 2A, and may be formed in any manner by which the insulating liner 31 may be formed. See FIG. 2A and accompanying text for a discussion supra of how the insulating liner 31 may be formed. The insulating liner replacing the insulative liner 54 alternatively insulates the semiconductor layer 16 from the conductive plug 55. As another alternative, it is within the scope of the present invention to have no insulative separation between the semiconductor layer 16 and the conductive plugs 55.

In FIG. 7, the conductive interface 56 may have any of the properties and functionality of the conductive interface 26. See FIG. 4 and accompanying text for a discussion supra of the conductive interface 26.

A combination of the $P^+$ diffusion 22, the $N^+$ diffusion 32, the $N^+$ diffusion 42, and the $P^+$ diffusion 52 may function as a thyristor (e.g., a silicon controlled rectifier). If the thyristor conducts large electrical currents, such as large currents generated during electrostatic discharge, then the bulk semiconductor substrate 12, which has a high thermal conductivity, serves as an effective medium for dissipating heat generated by the large electrical currents.

The conductive plugs 25, 35, 45, and 55 are self-aligned with the diffusions 22, 32, 42, and 52, respectively, and extend through a portion of the semiconductor layer 16 and insulator layer 15 such that an end of the conductive plug 25, 35, 45, and 55 is in conductive contact with the diffusion 22, 32, 42, and 52, respectively.

FIGS. 8–12 illustrate alternative embodiments, identified as electronic structures 90, in which diffusions and conductive plugs similar to those of FIG. 4 are fabricated according to a different manner of forming trenches than the trench-forming schemes described supra in conjunction with FIGS. 2A and 2B in relation to FIG. 4.

Figure 8:
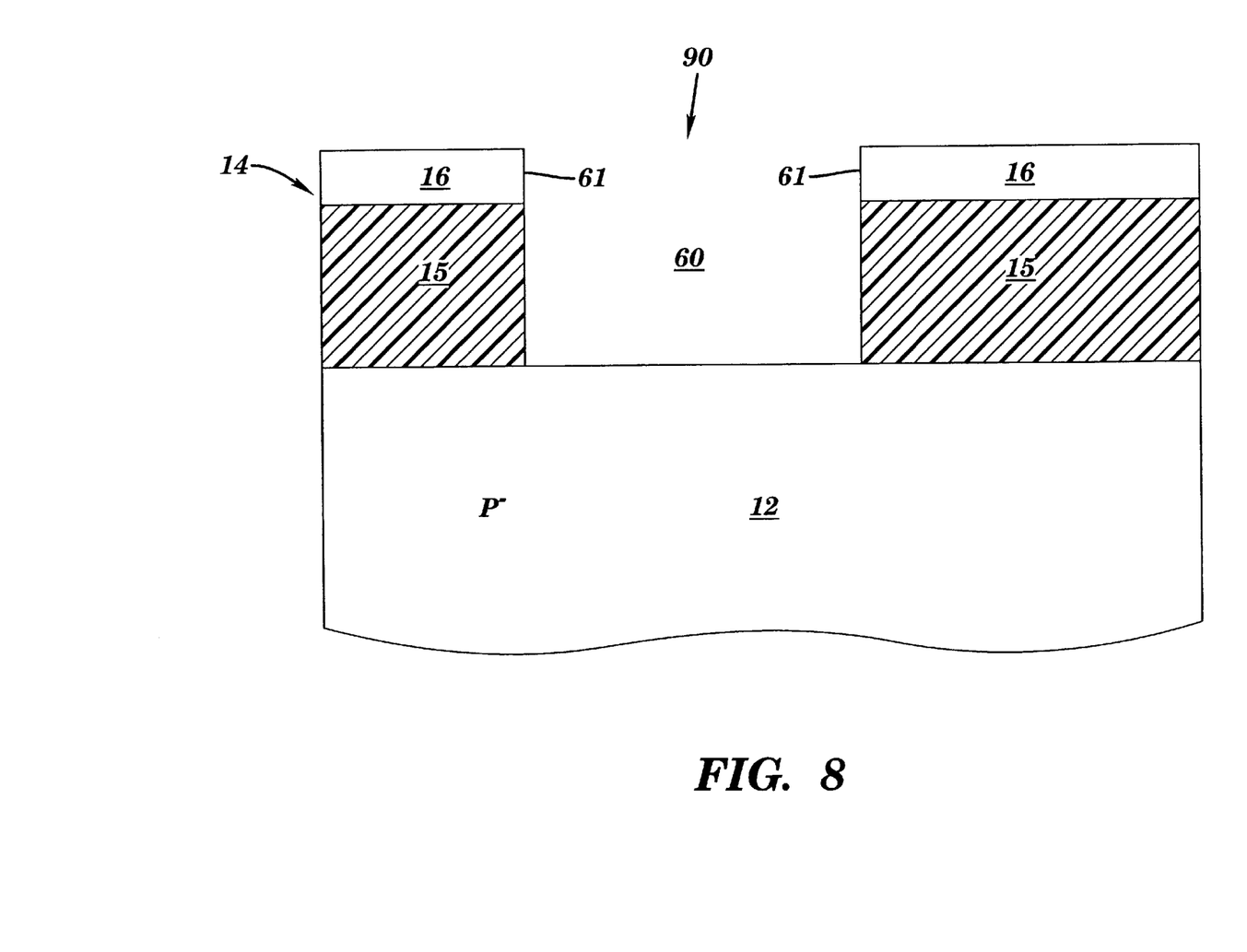
FIG. 8 depicts FIG. 1 after a first trench has been formed through the SOI structure such that a portion of the bulk semiconductor substrate is exposed.

FIG. 8 illustrates FIG. 1 after a trench 60 has been formed through the SOI structure 14 such that a portion of the bulk semiconductor substrate 12 is exposed. The trench 60 may be formed by any method known to one of ordinary skill in the art, including any method described supra for forming the trench 20 of FIGS. 2A or 2B. If the method of FIG. 2A is used, the trench 60 will have an insulating liner similar to the insulating liner 21 of FIG. 2A on a portion of a sidewall 61 of the trench 60, wherein said portion is adjacent to the semiconductor layer 16. Such an insulating liner constitutes an "insulative liner structure" for insulating the semiconductor layer 16 from conductive plugs to be subsequently formed (i.e., conductive plugs 75 and 85 shown infra in FIG. 11).

Figure 9:
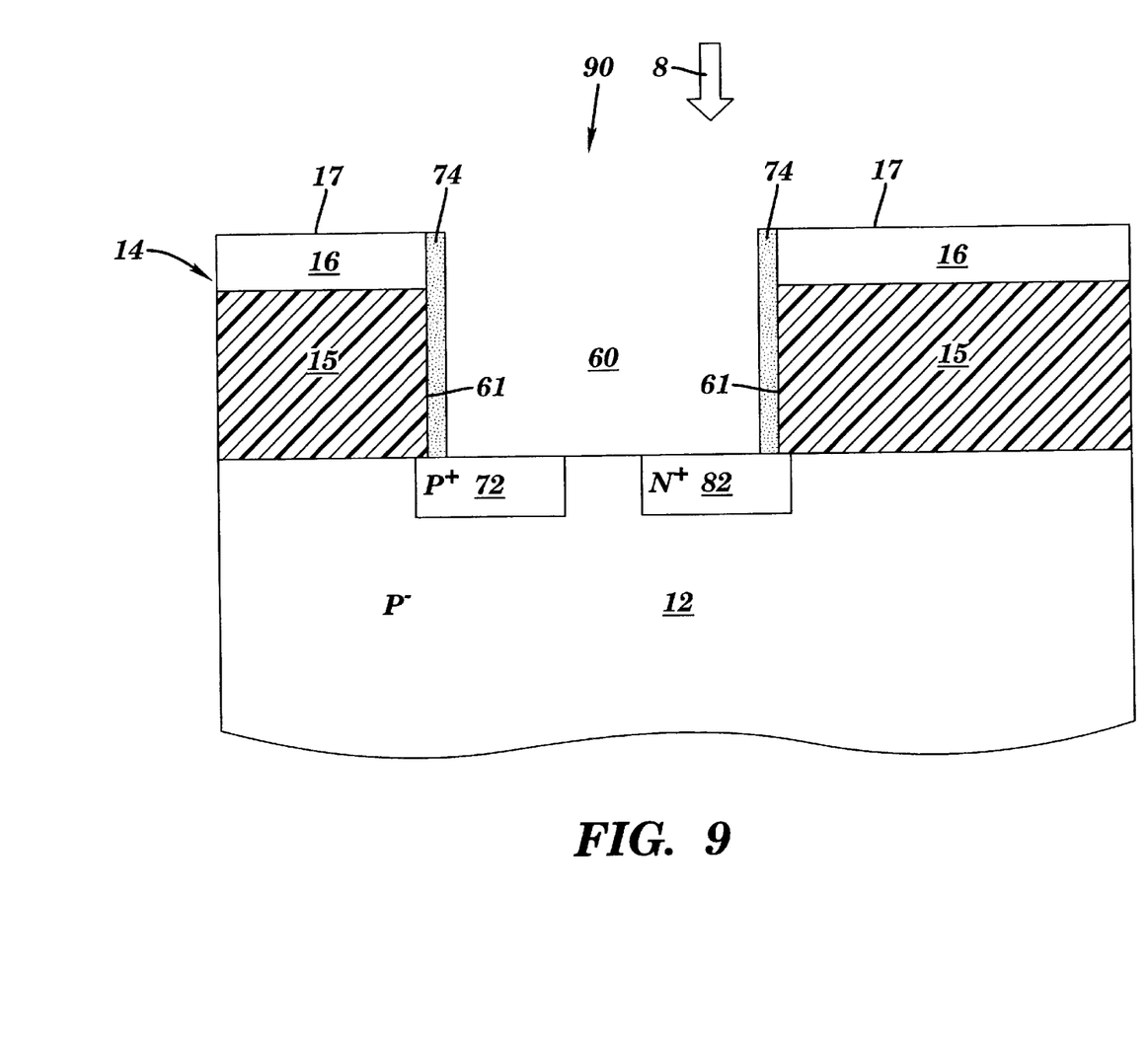
FIG. 9 depicts FIG. 8 after a P$^+$ diffusion and a N$^+$ diffusion have been formed in the bulk semiconductor substrate under the first trench.

FIG. 9 illustrates FIG. 8 after a $P^+$ diffusion 72 and a $N^+$ diffusion 82 have been formed in the bulk semiconductor substrate under the trench 60. The $P^+$ diffusion 72 and the $N^+$ diffusion 82 are formed separately by any method known to one of ordinary skill in the art. For example, to form the $P^+$ diffusion 72, the top surface 17 of the semiconductor layer 16, and portions of the trench 60 under which the $P^+$ diffusion 72 is not to be formed, are masked with a masking material, and $P^+$ dopant is implanted in the direction 8, or at an angle with respect to the direction 8, through the unmasked portion of the trench 60 and into a top portion of the bulk semiconductor substrate 12 under the unmasked portion of the trench 60. The masking is such that the $P^+$ dopant is prevented from striking with any portion of the electronic structure 90 except where the P+ diffusion 72 is formed. After the P+ diffusion 72 is formed, the masking material is removed by any known method such as by chemical removal. The N+ diffusion 82 may be formed in a manner similar to the aforementioned method of forming the P+ diffusion 72, or by any other method known to one of ordinary skill in the art. The P+ diffusion 72 may be formed either before or after the N+ diffusion 82 is formed. The trench 60 constitutes a "trench structure" used for implanting dopant to form the P+ diffusion 72 and the N+ diffusion 82.

FIG. 9 illustrates an insulative liner 74 on the sidewall 61 of the trench 60. The insulative liner 74 may be formed in the same manner, as described supra in conjunction with FIG. 3, that the insulative liner 24 was formed. The insulative liner 74 is an alternative to the insulating liner described supra (but not shown) in conjunction with FIG. 8. The insulative liner 74 (or the insulating liner relating to the discussion of FIG. 8) insulates the semiconductor layer 16 from conductive plugs to be subsequently formed within the trench 60, as will be described infra in conjunction with FIG. 12. The insulative liner 74 may be formed either before or after the P+ diffusion 72 and the N+ diffusion 82 are formed. The insulative liner 74 constitutes an "insulative liner structure" for insulating the semiconductor layer 16 from conductive plugs to be subsequently formed (i.e., conductive plugs 75 and 85 shown infra in FIG. 11).

Figure 10:
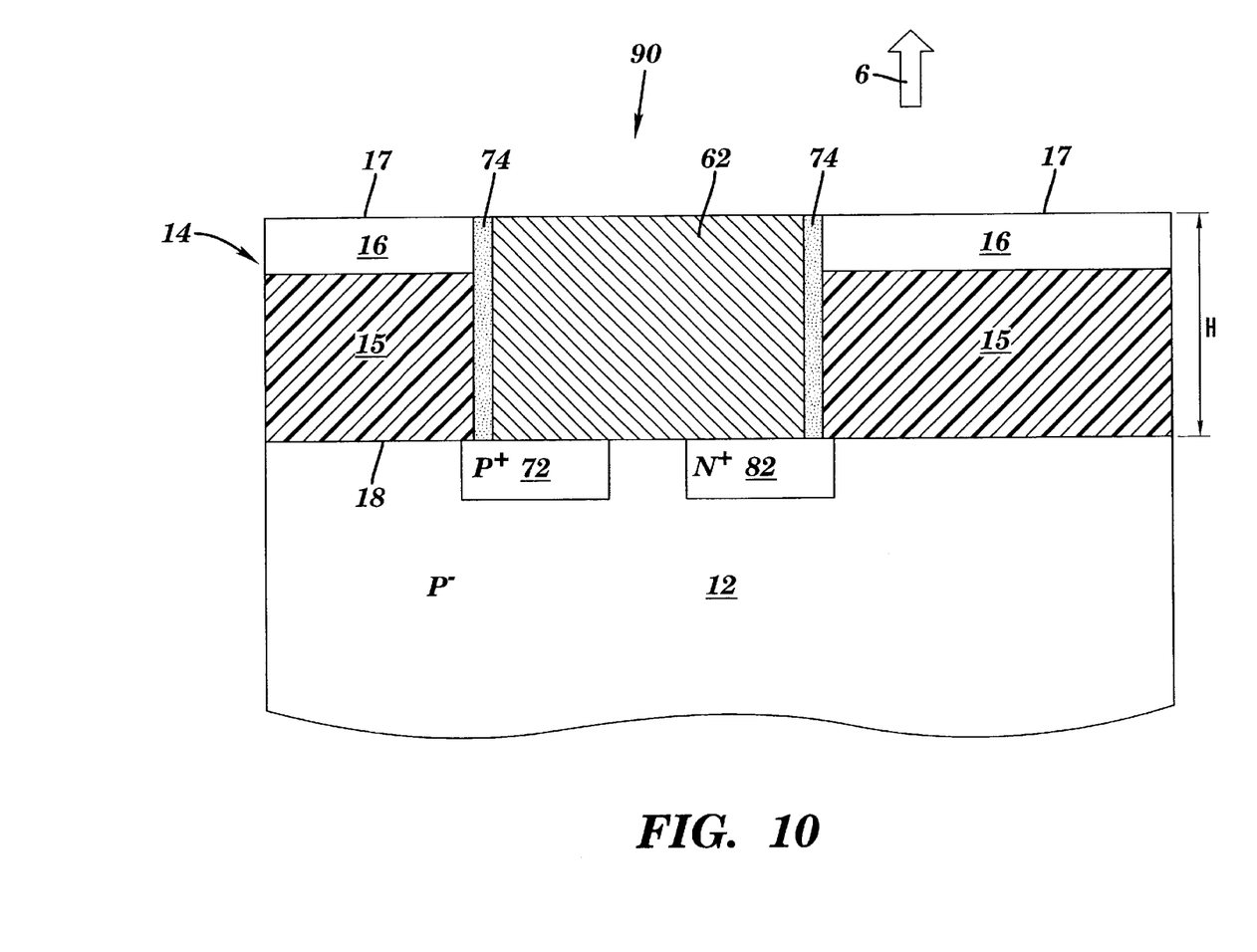
FIG. 10 depicts FIG. 9 after the first trench has been filled with a conducting material to form a conductive space that comprises the conducting material.

FIG. 10 depicts FIG. 9 after the trench 60 has been filled with conducting material 62. Conductive material 62 is in conductive contact with the P+ diffusion 72 and with the N+ diffusion 82. The conducting material 62 may include a semiconductor material such as doped polysilicon, or alternatively a metal (e.g., tungsten or aluminum) or a metallic alloy. If the conducting material 62 includes doped semiconductor material such as doped polysilicon, then the conducting material 62 should be distributed such that a portion of the conducting material 62 that is above the P+ diffusion 72 is doped P-type, and a portion of the conducting material 62 that is above the N+ diffusion 82 is doped N-type.

The conductive material 62 in FIG. 10 is shown as having the height H (also depicted in FIG. 4) extending from the bottom surface 18 of the insulator layer 15 to about the top surface 17 of the semiconductor layer 16. Alternatively, the conductive material 62 may have a height less than H, as measured in the direction 6 from the bottom surface 18 of the semiconductor layer 16. The conductive material may be placed in the trench 60 by overfilling the trench 60 with the conductive material followed by polishing, such as by CMP or any other suitable polishing method that planarizes the top surface 17 of the semiconductor layer 16.

Figure 11:
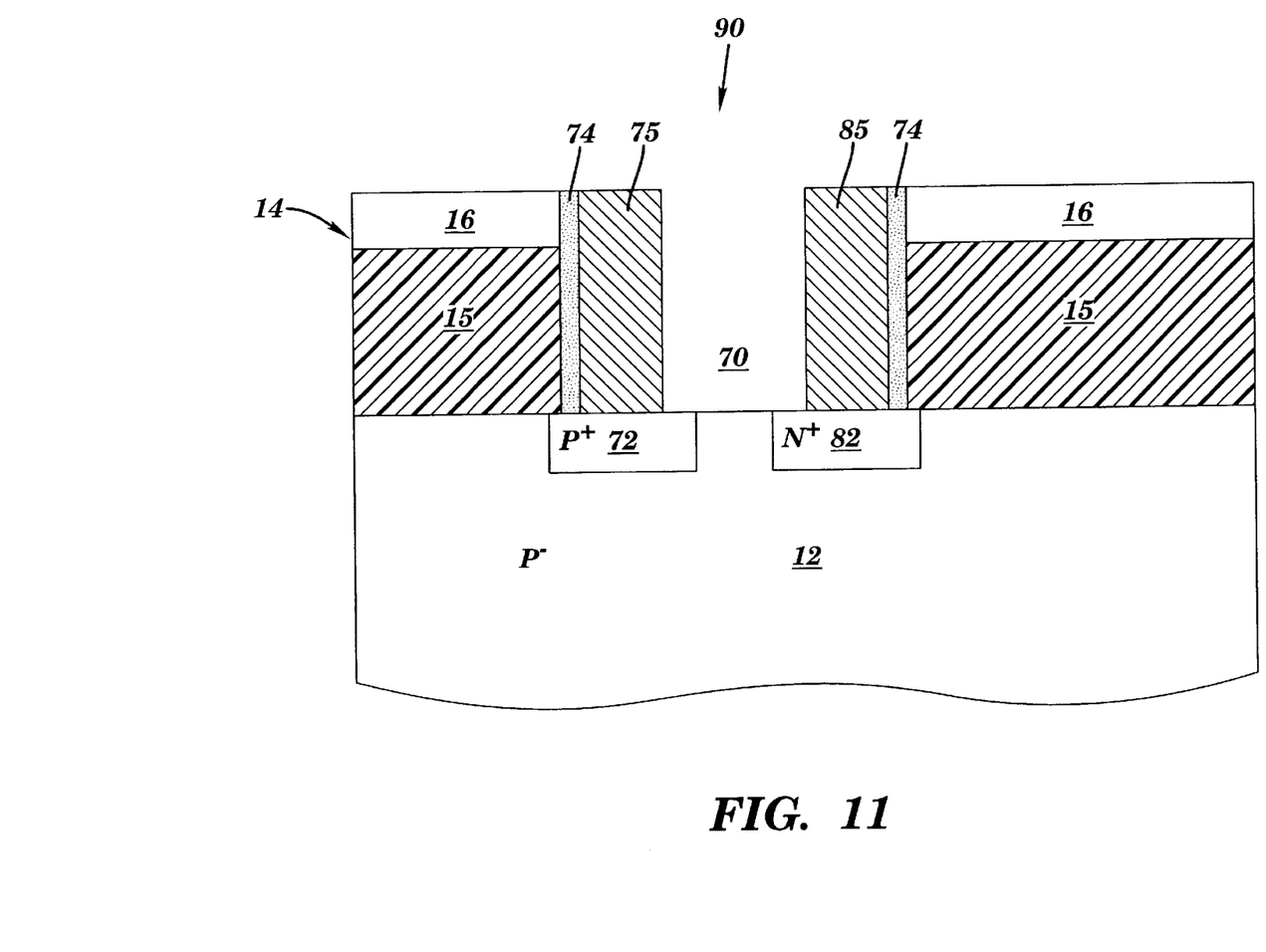
FIG. 11 depicts FIG. 10 after a portion of the conducting material has been removed from the conductive space, such that a first conductive plug, a second conductive plug, and a second trench remains, wherein the second trench separates the first conductive plug from the second conductive plug.

FIG. 11 depicts FIG. 10 after a portion of the conducting material has been removed from the conductive space 62, such that a conductive plug 75, a conductive plug 85, and a trench 70 remains, wherein the trench 70 separates the conductive plug 75 from the conductive plug 85. At least one edge of the conductive plug 75 and of the conductive plug 85 is self-aligned with diffusions 72 and 82, respectively, and with the sidewall 61 (see FIG. 9). Removing the portion of the conducting material is accomplished by any method known to one of ordinary skill in the art, such as, inter alia, photolithography and etching, mechanical drilling, or laser drilling. The conductive plugs 75 and 85 are "spacer plugs."

Figure 12:
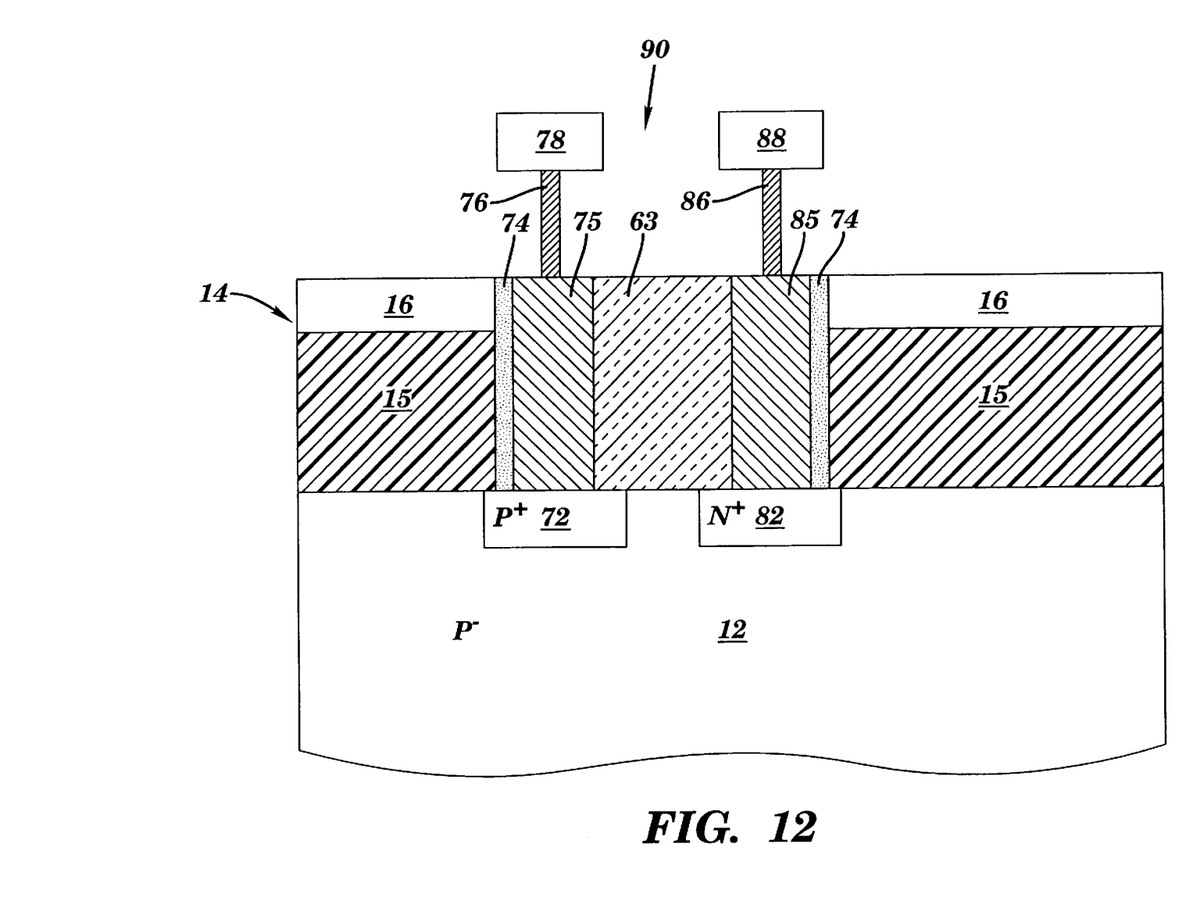
FIG. 12 depicts FIG. 11 after the second trench has been filled with insulation, the first conductive plug has been conductively coupled to a first electrical device, and the second conductive plug has been conductively coupled to a second electrical device.

FIG. 12 depicts FIG. 11 after the trench 70 has been filled with insulation 63. The insulation 63 may include any electrically insulating material such as silicon dioxide. Additionally in FIG. 12, the conductive plugs 75 and 85 have been conductively coupled to internal node or external pad 78 and 88, respectively, using a conductive interface 76 and 86, respectively. The internal node or external pad 78 and 88 each has any characteristic or feature of the internal node or external pad 28 described supra in conjunction with FIG. 4. The conductive interface 76 and the conductive interface 86 may each include any type of conductive interface known to one of ordinary skill in the art, such a composite of conductive contacts and conductive wiring lines.

A combination of the P+ diffusion 72 and the N+ diffusion 82 may function as a diode. If the diode conducts large electrical currents, such as large currents generated during electrostatic discharge, then the bulk semiconductor substrate 12, which has a high thermal conductivity, serves as an effective medium for dissipating heat generated by the large electrical currents. The diode, when operated in reverse bias, can also provide a diffusion capacitor.

The electronic structure 90 of FIG. 12 is analogous to the electronic structure 10 of FIG. 4 in terms of structure and functionality. The electronic structure 90 of FIG. 12 differs non-materially from the electronic structure 10 of FIG. 4 in that in FIG. 12 the conductive plugs 75 and 85 are separated by the insulative space 63, while in FIG. 4 the conductive plugs 22 and 32 are separated by a portion of the insulator layer 15 and a corresponding portion of the semiconductor layer 16. Accordingly, all variations and embodiments discussed supra for the electronic structure 10 of FIGS. 1–4 apply to the electronic structure 90 of FIG. 12. Additionally, the variations and embodiments shown supra in FIGS. 5–7 for the electronic structure 10 apply to the electronic structure 90 of FIG. 12. For example, the electronic structure 90 may comprise a doped well (e.g., a N-well) in the bulk semiconductor substrate 12 similar to the doped well 39 of FIG. 5. As a second example, the electronic structure 90 may comprise three diffusions (e.g., a PNP bipolar transistor or a NPN bipolar transistor such as shown supra for the electronic structure 10 in FIG. 6). As a third example, the electronic structure 90 may comprise four diffusions (e.g., a thyristor such as shown supra for the electronic structure 10 in FIG. 7). For forming multiple diffusions in the bulk semiconductor substrate 12 of the electronic structure 90, dopant must be implanted through the trench 60 (as discussed supra in conjunction FIG. 9) at each location in the bulk semiconductor substrate 12 where a diffusion is to be formed. Accordingly, the trench 60 constitutes a "trench structure" used for implanting dopant to form the P+ diffusion 72, the N+ diffusion 82, and any other diffusions. Additionally for forming multiple diffusions in the bulk semiconductor substrate 12 of the electronic structure 90, conducting material must be removed from the conducting space 62 as discussed supra in conjunction with FIG. 11, so as to leave a conductive plug above each diffusion, and the removed conducting material is subsequently replaced by the insulating material as discussed supra in conjunction with FIG. 12.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising:

a bulk semiconductor substrate having a semiconductor device, wherein the semiconductor device includes M diffusions, wherein M is at least 2, wherein a first diffusion of the M diffusions is a P+ diffusion, and wherein a second diffusion of the M diffusions is a N+ diffusion;

a silicon-on-insulator (SOI) structure on the bulk semiconductor substrate, wherein the SOI structure includes an insulator layer on the bulk semiconductor substrate and a semiconductor layer on the insulator layer; and M conductive plugs self-aligned with the M diffusions and extending through a portion of the SOI layer such that an end of each conductive plug is in conductive contact with a corresponding diffusion of the M diffusions.

2. The electronic structure of claim 1, wherein each conductive plug includes a conductive material selected from the group consisting of intrinsic polysilicon, doped polysilicon, tungsten, and aluminum.

3. The electronic structure of claim 1, wherein each conductive plug is of a same conductivity type as the corresponding diffusion.

4. The electronic structure of claim 1, wherein the each diffusion has been formed by implantation of dopant.

5. The electronic structure of claim 1, wherein each conductive plug is a through plug.

6. The electronic structure of claim 1, wherein each conductive plug is a spacer plug.

7. The electronic structure of claim 1, further comprising an insulative liner structure which insulatively separates each conductive plug from the semiconductor layer.

8. The electronic structure of claim 1, wherein the semiconductor device includes an electrostatic discharge device (ESD).

9. The electronic structure of claim 1, wherein the semiconductor device includes a diode or a diffusion capacitor.

10. The electronic structure of claim 1, wherein the bulk semiconductor substrate includes a doped well, and wherein a portion of the semiconductor device is within the doped well.

11. The electronic structure of claim 1, further comprising M conductive nodes and M conductive interfaces, wherein each interface of the M conductive interfaces is in conductive contact with a corresponding conductive plug of the M conductive plugs and a corresponding conductive node of the M conductive nodes.

12. The electronic structure of claim 1, wherein M is at least 3, wherein a third diffusion of the M diffusions is a N+ diffusion or a P+ diffusion, and wherein the semiconductor device includes a bipolar transistor.

13. The electronic structure of claim 1, wherein M is at least 4, wherein a third diffusion of the M diffusions is a P+ diffusion, wherein a fourth diffusion of the M diffusions is a N+ diffusion, and wherein the semiconductor device includes a thyristor.

14. A method for forming an electronic structure, comprising the steps of:

providing a bulk semiconductor substrate;

forming a silicon-on-insulator (SOI) structure on the bulk semiconductor substrate, wherein the SOI structure includes an insulator layer on the bulk semiconductor substrate and a semiconductor layer on the insulator layer;

forming a trench structure through the SOI layer, wherein an end of the trench structure is interfaced with the bulk semiconductor substrate;

forming a semiconductor device in the bulk semiconductor substrate by use of the trench structure, wherein the semiconductor device includes M diffusions, wherein M is at least 2, wherein a first diffusion of the M diffusions is a P+ diffusion, and wherein a second diffusion of the M diffusions is a N+ diffusion; and forming M conductive plugs self-aligned with the M diffusions and extending through a portion of the SOI layer such that an end of each conductive plug is in conductive contact with a corresponding diffusion of the M diffusions.

15. The method of claim 14, wherein each conductive plug includes a conductive material selected from the group consisting of intrinsic polysilicon, doped polysilicon, tungsten, and aluminum.

16. The method of claim 14, wherein each conductive plug is of a same conductivity type as the corresponding diffusion.

17. The method of claim 14, wherein the step of forming a semiconductor device includes forming each diffusion by implantation of dopant.

18. The method of claim 14, wherein each conductive plug is a through plug.

19. The method of claim 14, wherein each conductive plug is a spacer plug.

20. The method of claim 14, further comprising forming an insulative liner structure which insulatively separates each conductive plug from the semiconductor layer.

21. The method of claim 14, wherein the semiconductor device includes an electrostatic discharge device (ESD).

22. The method of claim 14, wherein the semiconductor device includes a diode or a diffusion capacitor.

23. The method of claim 14, wherein the bulk semiconductor substrate includes a doped well, and wherein a portion of the semiconductor device is within the doped well.

24. The method of claim 14, further comprising further comprising forming M conductive nodes and M conductive interfaces, wherein each interface of the M conductive interfaces is in conductive contact with a corresponding conductive plug of the M conductive plugs and a corresponding conductive node of the M conductive nodes.

25. The method of claim 14, wherein M is at least 3, wherein a third diffusion of the M diffusions is a N+ diffusion or a P+ diffusion, and wherein the semiconductor device includes a bipolar transistor.

26. The method of claim 14, further comprising wherein M is at least 4, wherein a third diffusion of the M diffusions is a P+ diffusion, wherein a fourth diffusion of the M diffusions is a N+ diffusion, and wherein the semiconductor device includes a thyristor.

* * * * *